(12) United States Patent
Jiang et al.

(10) Patent No.: US 9,706,646 B2
(45) Date of Patent: Jul. 11, 2017

(54) ORIGAMI ENABLED MANUFACTURING SYSTEMS AND METHODS

(71) Applicants: Hanqing Jiang, Chandler, AZ (US); Hongyu Yu, Chandler, AZ (US); Goran Konjevod, Livermore, CA (US); Yong Xu, Troy, MI (US)

(72) Inventors: Hanqing Jiang, Chandler, AZ (US); Hongyu Yu, Chandler, AZ (US); Goran Konjevod, Livermore, CA (US); Yong Xu, Troy, MI (US)

(73) Assignees: Arizona Board of Regenst acting for and on behalf of Arizona State University, Scottsdale, AZ (US); Lawrence Livermore National Security, LLC, Livermore, CA (US); Wayne State University, Detroit, MI (US)

( * ) Notice: Subject to any disclaimer, the term of this patent is extended or adjusted under 35 U.S.C. 154(b) by 0 days.

(21) Appl. No.: 14/761,209

(22) PCT Filed: Jan. 15, 2014

(86) PCT No.: PCT/US2014/011710
§ 371 (c)(1),
(2) Date: Jul. 15, 2015

(87) PCT Pub. No.: WO2014/113489
PCT Pub. Date: Jul. 24, 2014

(65) Prior Publication Data
US 2015/0342050 A1 Nov. 26, 2015

Related U.S. Application Data

(60) Provisional application No. 61/752,936, filed on Jan. 15, 2013.

(51) Int. Cl.
*H05K 1/14* (2006.01)
*H05K 1/18* (2006.01)
(Continued)

(52) U.S. Cl.
CPC .......... *H05K 1/028* (2013.01); *H05K 1/0278* (2013.01); *H05K 1/148* (2013.01); *H05K 1/181* (2013.01);
(Continued)

(58) Field of Classification Search
CPC ....... H05K 1/0278; H05K 1/148; H05K 1/181
See application file for complete search history.

(56) References Cited

U.S. PATENT DOCUMENTS 4,922,059 A      5/1990  Walker et al.
5,648,771 A  *  7/1997  Halgren ................ G06F 3/0202
                                                          248/118

(Continued)

FOREIGN PATENT DOCUMENTS

WO      WO-01/94253  A2    12/2001

OTHER PUBLICATIONS

Sant et al., An in situ heater for a phase-change-material-based actuation system, J. Micromech. Microeng. 2. 085-39 (2010).
(Continued)

*Primary Examiner* — William H Mayo, III
*Assistant Examiner* — Hiram E Gonzalez
(74) *Attorney, Agent, or Firm* — Ballard Spahr LLP

(57) ABSTRACT

An origami enabled manufacturing system. The system uses origami design principles to create functional materials, structures, devices and/or systems having an adjustable size and/or shape. An operational device can be coupled to a planar substrate shaped and sized to correspond to a desired origami shape of an origami pattern. A plurality of planar substrates can be coupled together by a plurality of connec-
(Continued)

tion members that corresponds to one or more crease of the origami pattern. An array of planar substrates can be formed that convert into a three dimensional structure with origami shape. The resulting three-dimensional structure provides smaller projection area, higher portability and deformability.

23 Claims, 11 Drawing Sheets

(51) Int. Cl.
  *H05K 1/02* (2006.01)
  *H01M 2/20* (2006.01)
  *H01M 10/04* (2006.01)
  *H01M 10/0525* (2010.01)
  *H01M 10/0583* (2010.01)
  *H01M 10/0585* (2010.01)
  *H01M 10/42* (2006.01)
  *H01M 6/40* (2006.01)
  *H01M 6/42* (2006.01)
  *H01G 11/78* (2013.01)

(52) U.S. Cl.
  CPC ............ *H01G 11/78* (2013.01); *H01M 2/204* (2013.01); *H01M 6/40* (2013.01); *H01M 6/42* (2013.01); *H01M 10/0436* (2013.01); *H01M 10/0525* (2013.01); *H01M 10/0583* (2013.01); *H01M 10/0585* (2013.01); *H01M 10/425* (2013.01); *H05K 1/0272* (2013.01); *H05K 1/0281* (2013.01); *H05K 1/0283* (2013.01); *H05K 2201/046* (2013.01); *H05K 2201/05* (2013.01); *H05K 2201/09036* (2013.01); *H05K 2201/10015* (2013.01); *H05K 2201/10037* (2013.01); *H05K 2201/10098* (2013.01); *H05K 2201/10113* (2013.01); *H05K 2201/10128* (2013.01); *H05K 2201/10151* (2013.01); *H05K 2201/10174* (2013.01); *H05K 2203/085* (2013.01); *H05K 2203/087* (2013.01); *H05K 2203/09* (2013.01); *H05K 2203/1184* (2013.01); *H05K 2203/302* (2013.01)

(56) References Cited

U.S. PATENT DOCUMENTS

| | | | |
|---|---|---|---|
| 6,050,962 A | 4/2000 | Kramer et al. | |
| 6,476,733 B1* | 11/2002 | Amiri | G06F 3/0221 |
| | | | 200/5 R |
| 6,695,457 B2 | 2/2004 | van Drieenhuizen et al. | |
| 7,215,547 B2* | 5/2007 | Chang | H05K 1/0272 |
| | | | 165/104.33 |
| 8,080,736 B2* | 12/2011 | Denatale | H01L 21/768 |
| | | | 174/250 |
| 2005/0099361 A1* | 5/2005 | Majer | G06F 1/1616 |
| | | | 345/1.3 |
| 2005/0110702 A1 | 5/2005 | Aoki et al. | |
| 2007/0279315 A1* | 12/2007 | Laves | G06F 1/1615 |
| | | | 345/1.1 |
| 2010/0053207 A1 | 3/2010 | Cohen et al. | |
| 2011/0227822 A1 | 9/2011 | Shai | |

OTHER PUBLICATIONS

Yang et al., A latchable microvalve using phase change of paraffin wax, Sensors and Actuators A 134, pp. 194-200 (2007).

International Search Report and Written Opinion was mailed on May 12, 2014 for Application No. PCT/US2014/011710, which was filed on Jan. 15, 2014 and published as WO2014/113489 on Jul. 24, 2014 (Inventor—Jiang et al) (7 Pages).

International Preliminary Report on Patentability was mailed on Jul. 21, 2015 for Application No. PCT/US2014/011710, which was filed on Jan. 15, 2014 and published as WO2014/113489 on Jul. 24, 2014 (Inventor—Jiang et al) (6 Pages).

\* cited by examiner (a)

(b)

ORIGAMI ENABLED MANUFACTURING SYSTEMS AND METHODS

CROSS-REFERENCE TO RELATED APPLICATIONS

The present application is a U.S. National Phase Application of International Application No. PCT/US2014/011710, filed Jan. 15, 2014, which claims priority to U.S. Application No. 61/752,936, filed Jan. 15, 2013, all of which application are incorporated herein fully by this reference.

BACKGROUND

Field

This application relates generally to origami enabled manufacturing systems and methods and, more particularly, to systems and methods to manufacture functional materials, structures, devices and/or systems having an adjustable size, shape and/or local structures based on origami principles.

Background Technology

Origami can be used to transform a flat sheet of paper or board into a finished sculpture through folding and sculpting techniques. In small or micro scale manufacturing (e.g., from cm to micro to nano), only very simple folding methods and structures have been explored to fabricate a structure. Moreover, the current material choice is limited, thereby limiting the functionality of the structure. At the same time, flexible, foldable and/or stretchable electronics are emerging as an attractive and promising new industry, but they are also limited by manufacturing technology which is not scalable, has a low yield, and is expensive and fragile. Therefore, there is a need in the pertinent art for a universal technology to fully employ origami structures with integration of soft and hard materials to produce wide functionality, reduce the space required, and improve portability and performance. The product scale can be from nano, micro, cm to meter level.

SUMMARY

Described herein are origami enabled manufacturing systems and methods. In one aspect, the origami enabled manufacturing system can use conventional manufacturing technology to produce fully functional material, structures, devices and/or systems on a substantially planar substrate. In use, the planar substrate can then be converted into a three-dimensional structure with origami shape by self-assembling and/or from external forces. The resulting origami 3-D products can provide smaller projection area (i.e., a more compact product or dense product), higher portability, deformability from folds for fully transformable devices and/or better performance in certain applications. Furthermore, the capability of repeatedly folding and unfolding of origami products provides a great platform of foldable, flexible, stretchable and/or curvilinear electronics, such as stretchable/flexible solar cells, stretchable/flexible antenna and the like.

The origami enabled manufacturing system can comprise a plurality of functional bodies, each functional body can have a plurality of side edges. The plurality of functional bodies can be arrayed in a predetermined pattern. The plurality of side edges can define a plurality of creases in the predetermined pattern and at least one side edge of each functional body can be positioned in opposition to at least one side edge of another functional body in the predetermined pattern.

The origami enabled manufacturing system can comprise a plurality of connection members, an at least one connection member can be coupled to and positioned between opposed functional bodies. In an aspect, each connection member can selectively movable between a fixed position, in which no relative movement between connected functional bodies can be allowed. In another aspect, each connection member can selectively movable between a pliable position, in which relative movement between connected functional bodies can be allowed.

In one aspect, each functional body can comprise a substrate. In another aspect, each functional body can comprise a substrate and at least one device attached thereto or formed integrally with the substrate. The substrate can be, for example, a rigid substrate. As another example, the substrate can be a foldable substrate. In still another aspect, the substrate can be, for example, a material, structure, device and the like manufactured as a substantially planar shape using conventional industrial standard technology. In still another aspect, the functional bodies can be shaped and sized to correspond to a desired origami shape, with the side edges of functional bodies corresponding to creases in the origami pattern.

The origami enabled manufacturing system can be designed and formed as an array of functional bodies with at least one connection member positioned between and coupled to the functional bodies, according to one aspect. In another aspect, the connection members can be flexible and/or stretchable connection members. For example, the connection members can be electrodes, fluidic channels, mechanical hinges and the like.

Additional advantages of the invention will be set forth in part in the description which follows, and in part will be obvious from the description, or may be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DESCRIPTION OF THE DRAWINGS

These and other features of the preferred embodiments of the invention will become more apparent in the detailed description in which reference is made to the appended drawings wherein.

DETAILED DESCRIPTION

Figure 1:
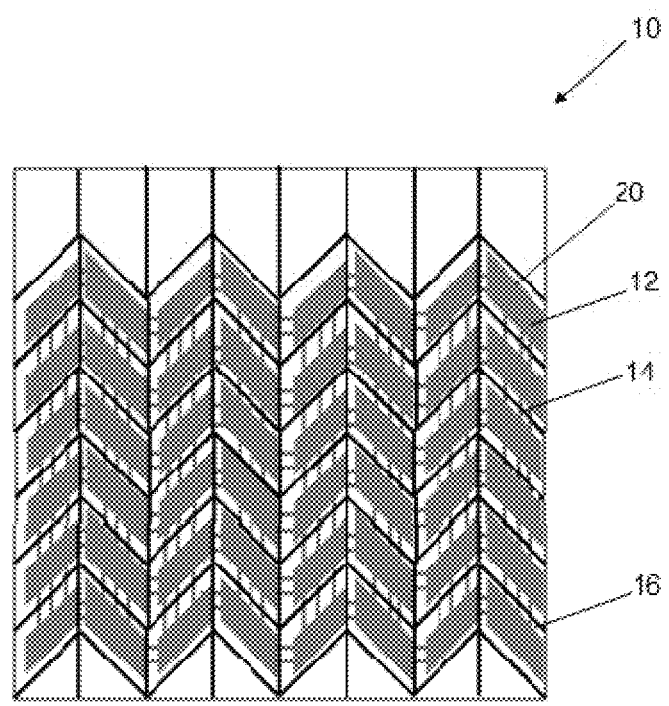
FIG. 1 is a plan view of an origami enabled manufacturing system according to one aspect.

The present invention can be understood more readily by reference to the following detailed description, examples, drawings, and claims, and their previous and following description. However, before the present devices, systems, and/or methods are disclosed and described, it is to be understood that this invention is not limited to the specific origami patterns, devices, systems, and/or methods disclosed unless otherwise specified, and, as such, can, of course, vary. It is also to be understood that the terminology used herein is for the purpose of describing particular aspects only and is not intended to be limiting.

The following description of the invention is provided as an enabling teaching of the invention in its best, currently known embodiment. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

As used throughout, the singular forms "a," "an," and "the" include plural referents unless the context clearly dictates otherwise. Thus, for example, reference to "a crease" can include two or more such creases unless the context indicates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

The word "or" as used herein means any one member of a particular list and also includes any combination of members of that list.

As used herein, the terms "origami" refers to the art of folding in which a flat sheet is transformed into a three-dimensional shape through folding and sculpting techniques. It can, however, also refer to kirigami (in which the sheet is cut in addition to folded), or any other types of "gami", including wet-folding, modular origami and the like.

Although reference will be made herein to small or micro scale (from cm to micro to nano levels), it is understood that origami enabled manufacturing systems and methods can also be extended to a large scale. For example, in building construction, tiles can be pre-patterned in a factory using the origami principle disclosed herein and then assembled on site.

Figure 2:
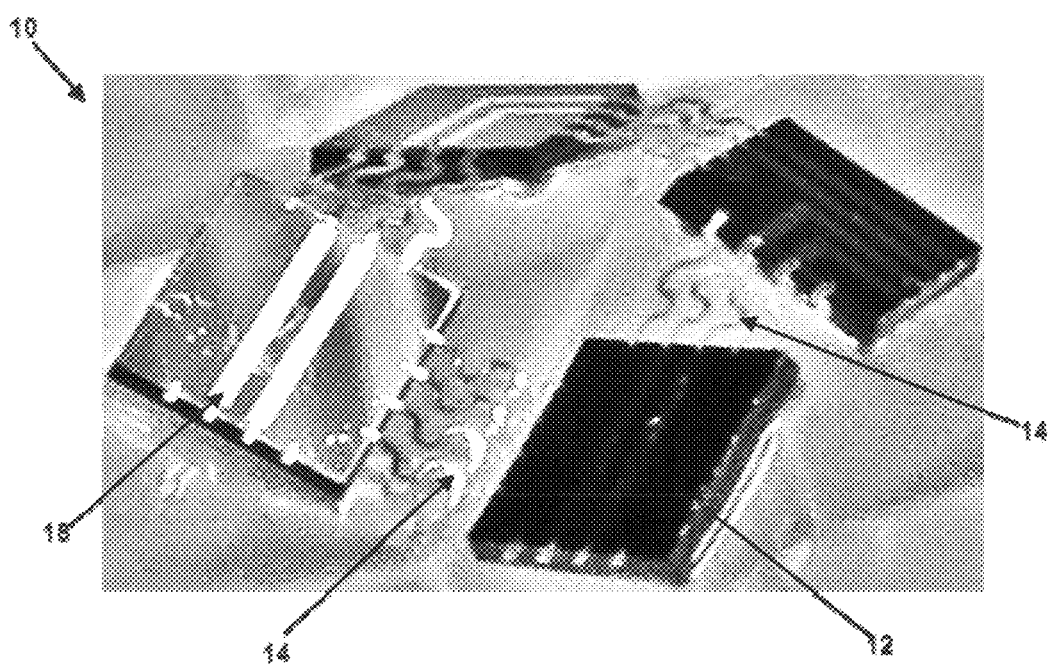
FIG. 2 is a photograph of an origami enabled manufacturing system according to one aspect.

With reference to FIGS. 1 and 2, the origami enabled manufacturing system 10 can comprise a plurality of functional bodies 12 coupled together by a plurality of connection members 14 positioned between opposed functional bodies. In one aspect, each functional body 12 can comprise a substrate 16. For example, the substrate 16 can be a silicon substrate. In still another aspect, each functional body can comprise a substrate and at least one device 18 attached thereto or formed integrally with the substrate. The substrate can be, for example, a foldable substrate. Alternatively, the substrate 16 can be a substantially rigid substrate. In still another aspect, the substrate can be, for example, a material, structure, device and the like manufactured as a substantially planar shape using conventional industrial standard technology. In still another aspect, the functional bodies 12 can be shaped and sized to correspond to a predetermined pattern or array (e.g., a desired origami shape), with at least a portion of the side edges 20 of a functional body corresponding to creases in the origami pattern. In another aspect, at least one side edge of each functional body 12 can be positioned in opposition to at least one side edge of another functional body in the predetermined pattern. For example, at least one side edge of each functional body can be positioned adjacent to at least one side edge of another functional body in the predetermined pattern. As another example, at least one side edge of each functional body can be positioned substantially parallel to at least one side edge of another functional body in the predetermined pattern. Thus, the functional bodies 12 can be formed into shapes corresponding to portions of an origami pattern.

The at least one device 18 can be any material, structure, device and/or system. For example, the at least one device could be an electronic device, a pneumatic device, a hydraulic device and the like. In another example, the at least one device 18 can be a metallic material, polymeric material, a wooden material, a textile and the like. As can be appreciated, the at least one device can be almost any material, structure, device and/or system capable of being attached to a substrate.

In one aspect, the at least one connection member 14 can be coupled to and positioned between opposed functional bodies. In an aspect, each connection member can be selectively movable between a fixed position, in which no relative movement between connected functional bodies can be allowed and a pliable position, in which relative movement between connected functional bodies can be allowed.

In one aspect, the origami enabled manufacturing system 10 can comprise means for selectively actuating the at least one connection member to allow for the selective displacement of the at least one functional body relative to another functional body. For example, the means for selectively actuating the at least one connection member can comprise an electrode, a fluidic channel, a mechanical hinge and the like.

In a further aspect, the at least one connection member 14 can be a flexible, pliable and/or stretchable connection member. For example, the at least one connection member can comprise an electrode, a fluidic channels, a mechanical hinge and the like. However, it is contemplated that, optionally, the at least one connection member 14 does not necessarily have to have a function other than the ability to couple two functional bodies 12 together. That is, for example and without limitation, the at least one connection member can simply be a flexible material such as a flexible polymer. If the at least one connection member 14 comprises a plurality of connection members, it is contemplated that each connection member can be a different or the same type connection member. For example, a first connection member 14 could an electrode and a second connection member could be a fluidic channel, an electrode, or any other type of connection member. It is contemplated any one or more connection members coupling adjoined functional bodies can comprise means for selectively actuating the at least one connection member to allow for the selective displacement of the at least one functional body relative to another functional body and, conversely, it is contemplated that any one or more connection members coupling adjoined functional bodies can comprise a flexible, non-actuating, material.

Figure 3:
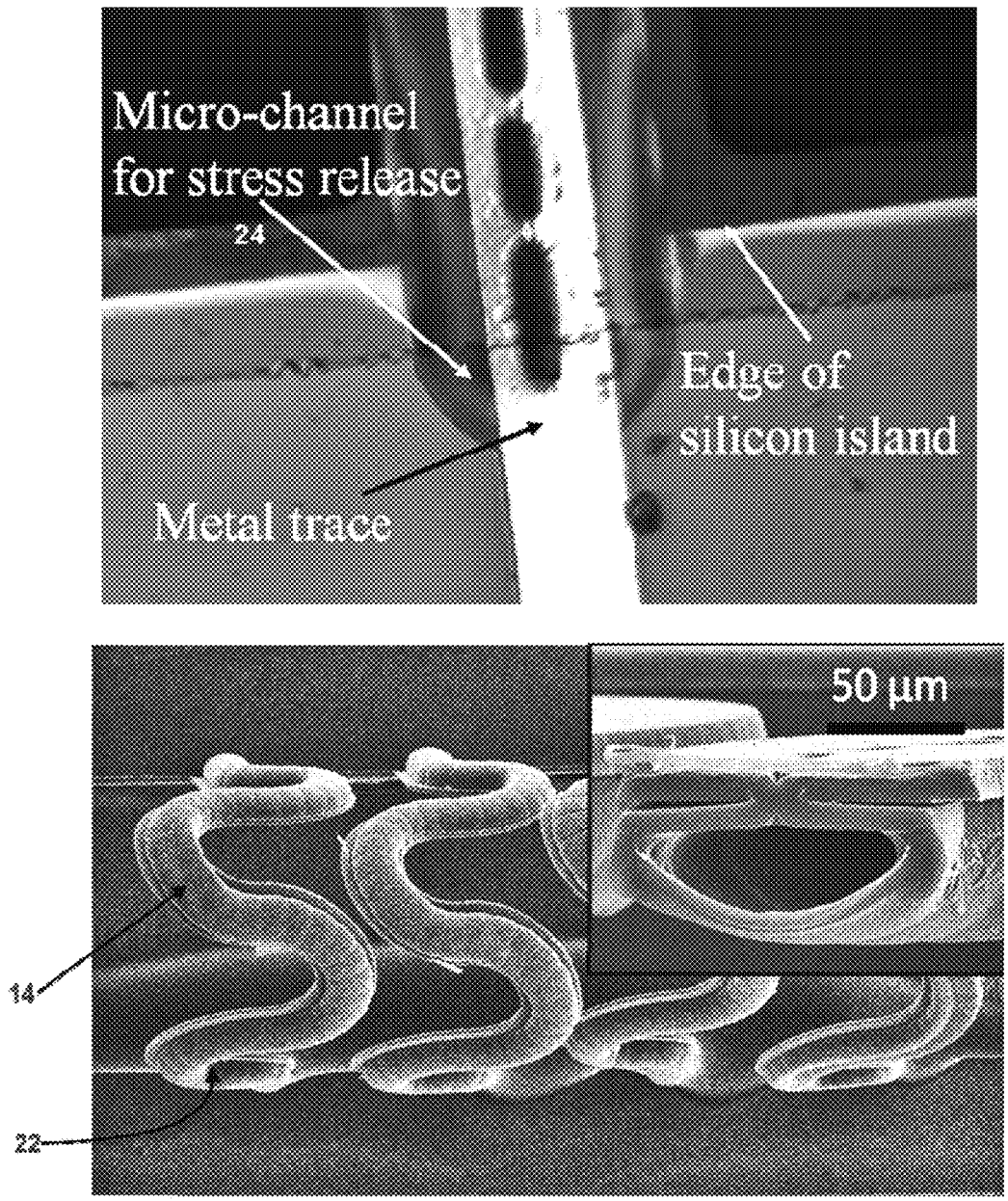
FIG. 3 is a plurality of photographs showing a connection member of the origami enabled manufacturing system of FIG. 1.
Figure 4:
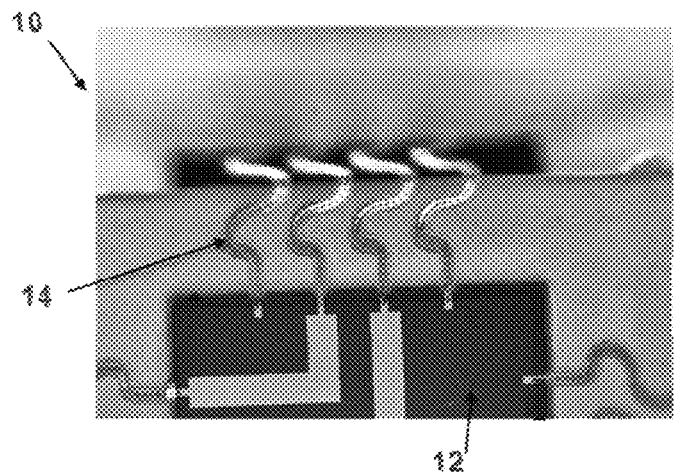
FIG. 4 is a plurality of photographs showing a connection member of the origami enabled manufacturing system of FIG. 2 undergoing deformation and the resultant changes in resistance of the connection member.
Figure 4:
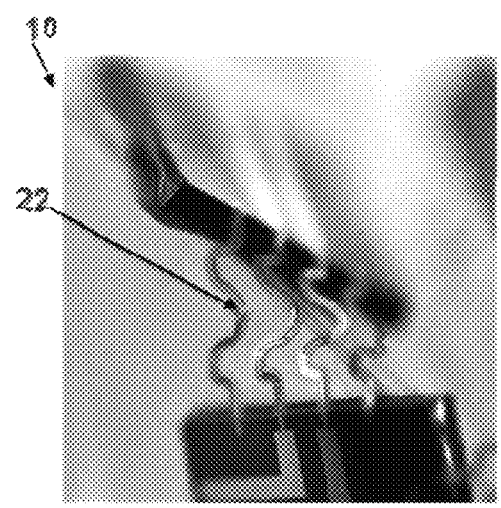
Figure 4:
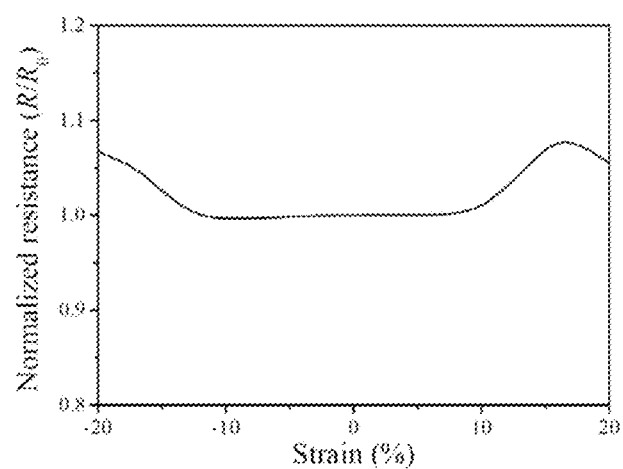

In one aspect, and with reference to FIGS. 3 and 4, the at least one connection member 14 can be formed into, for example and without limitation, a substantially "S" or serpentine-shape 22. Optionally, and without limitation, it is contemplated that the at least one connection member 14 can be substantially "C" shaped, substantially "U" shaped, substantially linear and the like. In another aspect, at least one channel 24 can be defined in a portion of the at least one connection member in order to relieve a portion of the stress created during bending. Further, the at least one channel defined in the at least one connection member 14 can also provide more functionality such as pneumatic driving and the fluidic interconnection between origami pieces and with functional devices, described more fully below. Referring now to FIG. 4, the "S" or serpentine-shaped connection member can survive folding (a) and twisting (b) with little change in the resistance (c). For example, the resistance is almost unchanged when a 2×2 silicon functional body connected by serpentine connection member was subjected to deformations, such as folding (a) and twisting (b).

In one aspect, the at least one connection member 14 can be formed from a material configured to withstand the imposed bending stress formed when adjacent and adjoined functional bodies 12 are folded together to form an desired origami pattern and/or structure. In another aspect, the at least one connection member can comprise at least one flexible layer. For example, the at least one connection member can be a relatively soft material, such as a polymer, gel and the like formed into a flexible layer. As an example, the polymer can be poly-para-xylylene. As another example, the polymer can comprise an electrically conductive polymer. In another aspect, the at least one connection member can further comprises at least one metal material, such as, for example, and without limitation, a metal trace, e.g., Au, Cr, and the like.

In another example, the at least one connection member 14 can be formed from a plurality of layers, such as a first layer forming a top or bottom of the at least one connection member 14, or double layers on both the top and bottom of the at least one connection member, and/or multiple layers as necessary depending on the requirement of a particular application. In one aspect, the flexible layer of the at least one connection member 14 can be bonded to the functional body 12 with possible reinforced folding structures. Alternatively, a fabrication process can use soft materials (such as polymer and/or gel), or combination of soft and hard materials to produce enhanced folding structure only at the connection between functional bodies. In another aspect, the soft material can be applied as a flexible layer over a functional portion of the connection member (that is, optionally, over an electrode, a fluidic channels, a mechanical hinge and the like).

After fabrication and assembly of the functional bodies 12 and the at least one connection member 14 (described below according to one aspect), the origami enabled manufacturing system 10 can be folded into the origami pattern by self-assembling and/or external forces. In one aspect, the external forces can comprise at least one of a thermal double layer, a shape changing polymer, a shape changing alloy, an electrochemical force, a mechanical force, an electrostatic force, a magnetic force and the like. By varying the amount and/or direction of the forces, stretchability and deformability can be realized by folding and unfolding the system along the borders between the functional bodies. Thus, without requiring the use of elastomeric materials, stretchability and deformability can be realized. Alternatively, the functional bodies 12 can be folded to a desired folded shape before the at least one device has been bonded thereto.

The folded origami shape can be the final product, according to one aspect. If so, a package can be formed to finish the system 10 with appropriate protection and/or interfaces to couple the system to its surrounding environment. If the system will be used with repeated folding and unfolding, a suitable interface can be built to connect the system with outside environments.

Figure 5:
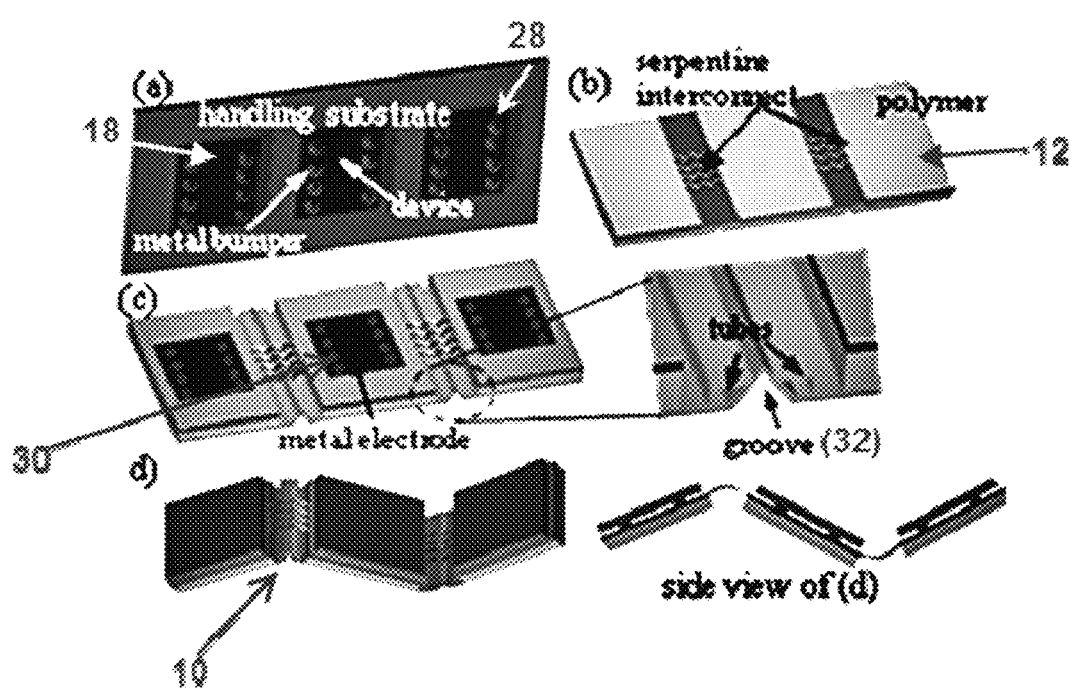
FIG. 5 is a plurality of views showing a method for forming an origami enabled manufacturing system according to one aspect.

To assemble an origami enabled manufacturing system, in which a stretchable and deformable electronic device is formed, in one aspect, at least one electronic device 18 can be attached to a handling surface 26 as illustrated in FIG. 5. The at least one device can be manufactured using any industrial process. In another aspect, the at least one device 18 can be attached to the handling surface with, for example and without limitation, metal bonding bumpers 28.

In one aspect, the substrate 16 of the functional body 12 can comprise a silicon wafer formed with a patterned metal layer 30 on a top surface of the wafer and at least one etched groove 32 on a bottom surface of the wafer. The at least one groove on the bottom surface of the wafer can be etched per a predetermined origami pattern. In another aspect, the top and bottom surface of the wafer can be at least partially covered with a polymer, such as, for example and without limitation, parylene C, to function as the connection member 14 and a guide for folding, respectively. The at least one connection member can, in this example, thus consist of metal traces encapsulated in polymer.

Figure 6:
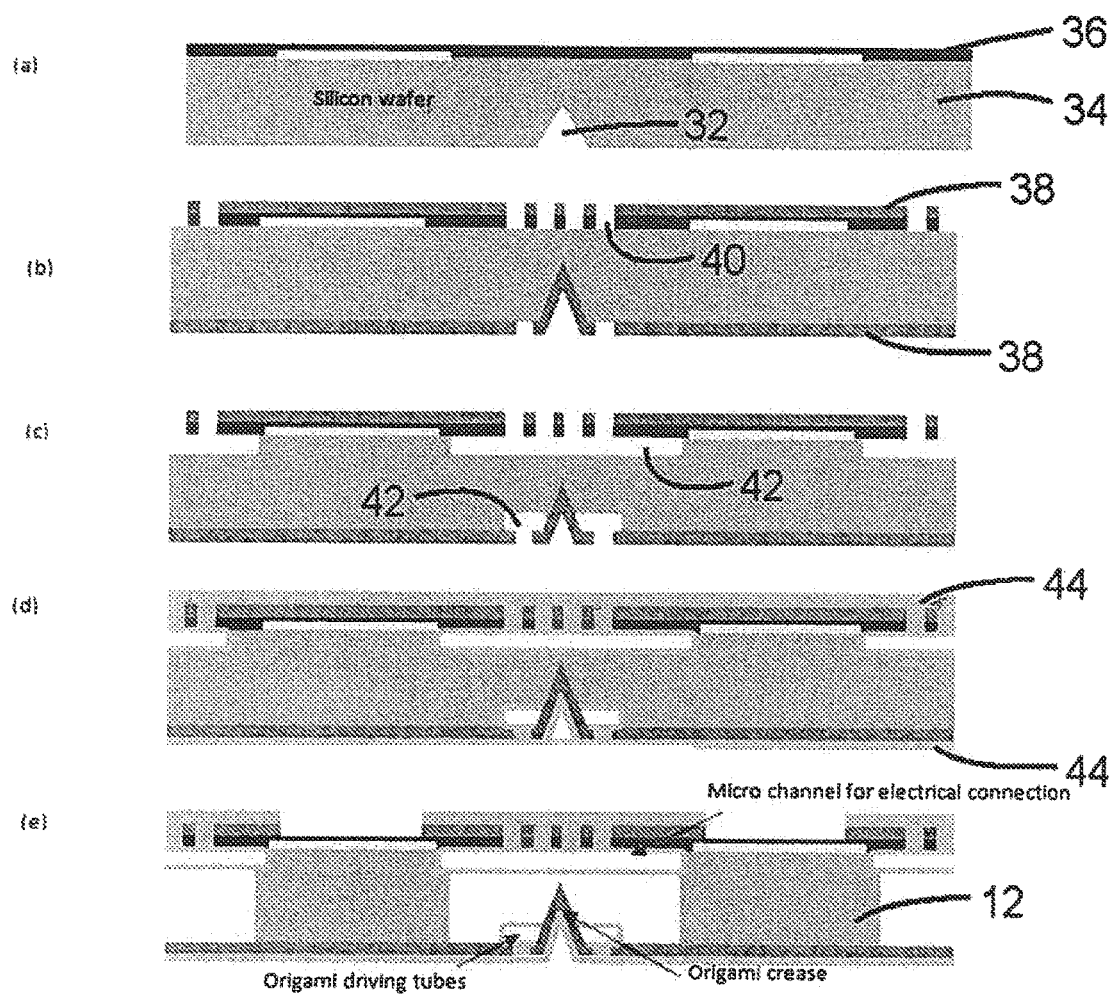
FIG. 6 illustrates a plurality of steps of a method for forming a connection member of an origami enabled manufacturing system according to one aspect.

More specifically, and with reference to FIG. 6, the substrate 16 of the origami enabled manufacturing system in which a stretchable and deformable electronic device can be a silicon wafer 34. In one aspect, the silicon wafer can have a thickness of, for example 300 μm. On a back surface of the wafer the at least one groove 32 can be defined having a groove depth of, for example 100 μm. In one aspect, the groove can be patterned and etched by different approaches and chemicals, such as, for example and without limitation, Tetramethylammonium hydroxide (TMAH). On a top surface of the wafer, an oxide layer (for example, 0.5 μm in thickness) can be patterned using photolithography and a buffered oxide etch, and a metal layer (e.g., an aluminum layer) 36 having a thickness (for example, 220 nm) can be evaporated and patterned to the top surface.

In one aspect, a first layer 38 of polymer, such as for example and without limitation, parylene C, having a thickness of about 5 μm can be deposited on the top surface and the bottom surface of the wafer using a vapor deposition method. As can be appreciated, parylene C is the generic name of poly-para-xylylene, which can be conformably deposited at room temperature with perfect mechanical and other properties. In one aspect, the parylene C layers and the meal layer (e.g., an aluminum layer) 36 can then be patterned by forming small holes 40 in a row along the intended center of a parylene channel. In one aspect, the holes defined in the parylene C can serve as a mask for $XeF_2$ to etch a portion of the substrate 16. For example, the $XeF_2$ can etch a portion of the substrate to form at least one channel trench and/or tube 42 (e.g., at least one lower channel and/or at least one upper channel) by undercutting the silicon substrate. In an aspect, at least one upper channel 42 can be a plurality of trenches and/or tubes defined underneath the metal layer (e.g., aluminum layer) 36.

In an aspect, at least one lower channel 42 can be a plurality of trenches and/or tubes defined on a bottom surface of the substrate 16 proximate a side edge of the functional body that forms a crease in the predetermined pattern (e.g., a desired origami pattern). In an aspect, at least one upper channel 42 can be a plurality of trenches and/or tubes defined on a top surface of the substrate proximate a side edge of the functional body that forms a crease in the predetermined pattern. The plurality of upper and lower channels can be parallel to the plurality of side edges of the plurality of functional bodies. In an aspect, at least a portion of the plurality of upper channels 42 can underlie at least a portion of the at least one connection member 14, and each lower channel of the plurality of lower channels can underlie one respective upper channel of the plurality of upper channels. In an aspect, the plurality of upper channels and the plurality of lower channels are selectively filled with air at a select air pressure. the air pressure in the upper and lower channels can be different.

After the $XeF_2$ etch, a second polymer (for example, parylene C) layer 44 can be then deposited onto the substrate 16, conformally coating the trench and/or tube 42 and sealing the access holes 40 defined in the first layer 38 of parylene. In one aspect, the second and/or first parylene layer can then be patterned by oxygen plasma to shape the outline of the device and open contact pads. In another aspect, front side deep reactive ion etching (DRIE) and $XeF_2$ can finish the process by defining individual silicon functional bodies 12 and releasing the parylene electric connections and creases for origami.

Another structure used to manufacture a stretchable and deformable electronic device is the origami driving tube 42 attached to origami creases. In one aspect, these tubes can have two sets and each set can connect together. In use, air pressure or vacuum pressure can be introduced into these tubes and can provide a driving force to bend the crease up or down.

Figure 7:
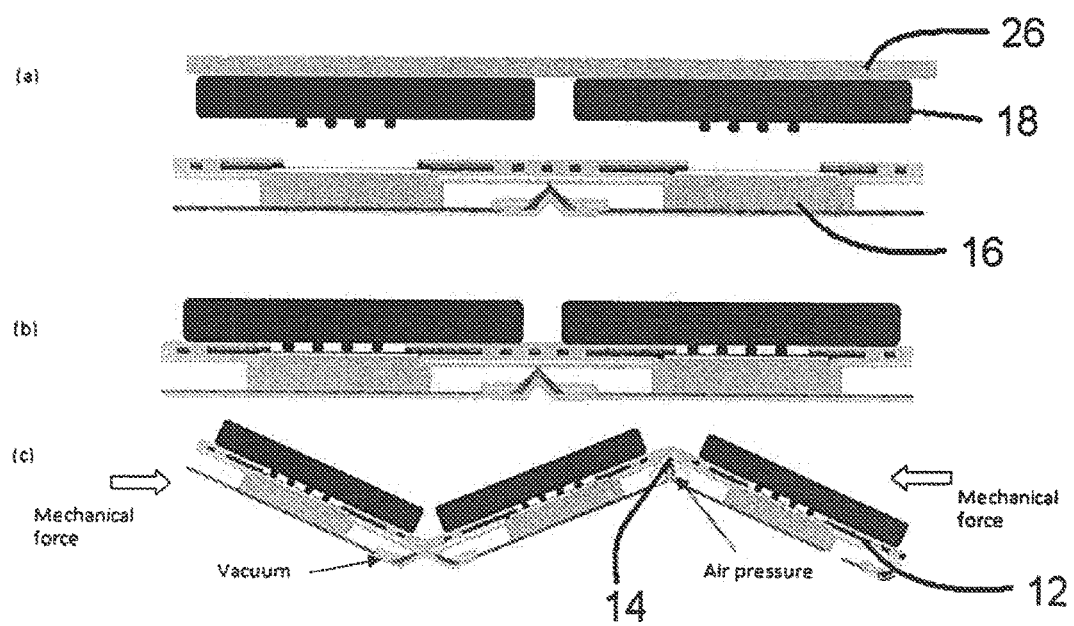
FIG. 7 illustrates a plurality of steps for coupling the connection member of FIG. 6 to a functional device for forming an origami enabled manufacturing system according to one aspect.

After the substrate 16 has been formed and etched as desired, the functional device 18 and the substrate can be aligned and brought together as illustrated in FIG. 7. In one aspect, flip-chip bonding and/or other low temperature bonding (such as screen printing conductive epoxy bonding) can be performed to couple the device to the substrate. Any handling surface 26 for holding the device can be removed by etching and/or other methods.

In one aspect, air pressure and/or vacuum pressure can be introduced into the tubes attached to the crease region to induce folding around the crease. For example, air pressure and/or vacuum pressure can cause a first functional body 12 to be positioned at an angle of about 20 to 30 degrees relative to a second functional body. In another aspect, a lateral mechanical compressive force can further induce folding to finish the origami folding. Once the origami folding is formed, air pressure and vacuum can be removed, since the folding in the polymer can memory the shapes.

This process as described herein can be scalable for mass production. This process also not only allows the integration of multiple functional devices, but also enables easy self-assembly of the origami. Specifically, asymmetries in the polymer tubes can be created in either or both of vertical and horizontal directions. By taking advantages of these asymmetries, pneumatic pressure or vacuum pressure can be applied to the channels and/or tubes to realize self-folding of the origami structure with pre-defined patterns. Furthermore, bi-stable bucking cable structures can be fabricated that allow the maintaining of the folded state even after the external force is removed.

Transformative applications can be achieved when the uniqueness of origami, for instance, foldability and compactness, are integrated with functions of rigid devices. In order to develop a universal, robust, low-cost and scalable manufacturing technology by integrating origami and functional devices, foldable origami patterns can be integrated with devices in a scalable means, and reliable connecting members can be positioned between functional pieces on each flat origami surface that tolerates creasing, folding, and other deformations. Once the foldable origami patterns are integrated with devices, upon folding, the functional body is not deformed, but rather is displaced due to the folding process. As shown in FIGS. 2, 5 and 7, the folding process brings the functional bodies closer together, effectively making the overall product more compact.

The origami enabled manufacturing system 10 can be used in a variety of applications. For example, flexible, stretchable, foldable, and deformable electronics can be formed. The flexible electronics formed from the origami enabled manufacturing system can be comprised of conventional plastic materials (used alone or in combination with elastic materials) that can bear high temperature during fabrication, and can be compatible with industry standard and high volume manufacture technology. Further, flexible electronics formed from the origami enabled manufacturing system can be easy to scale up, low cost, and robust when compared to conventional systems. Flexible electronics formed from the origami enabled manufacturing system can be used, for example, in energy storage and source (e.g. battery, solar cells and supercapacitors), consumer products (e.g. foldable displays, illumination, antenna and foldable toys), wearable electronics (e.g. health monitoring system and communication system), industrial fabrication process (chip packaging, system packaging) and the like. The origami enabled manufacturing system 10 can make these products more compact, portable and durable without sacrificing performance.

As an example, the origami enabled manufacturing system 10 can be used to improve the capacity of batteries. Conventional energy storage devices such as lithium ion (Li-ion) batteries can be considered two-dimensional (2-D) devices. The origami enabled manufacturing system 10 can be used to increase the energy per unit area such that batteries can be used for devices that have a limited area, such as for on-chip power. To maintain the same energy of the battery at a decreased areal footprint, a three dimensional (3-D) battery designs can be realized by implementing the disclosed methods and systems. For example, employing origami designs, an optimized conventional Li-ion battery structure can be folded to form a compact structure, which would improve its areal energy density without using complicated electrode geometries. For example, battery arrays (e.g., devices shown in FIG. 5a) can be fabricated and bonded with origami patterns following the processes described herein.

Another advantage of the origami enabled manufacturing system 10 is that after manufacturing of high performance functional materials and devices on a planar surface the planar system can become a three dimensional system which can improve the performance by increasing the actual surface area for a given planar surface area.

Another advantage of the origami enabled manufacturing system 10 is that it does not involve elastomeric materials and can be compatible with a mainstream CMOS process for high-performance devices. The systems and methods can be readily applied to other functional devices, ranging from sensors, displays, antenna, to energy storage devices. The systems and methods can be seamlessly integrated with mature microelectronics process to fabricate functional devices that are able to survive combined stretching, compression, bending and torsion, in both planar and curvilinear states, with heretofore unseen functionalities. An example of origami-enabled Si solar cells have demonstated that solar cells can reach up to 644% areal compactness while maintain reasonable good performance upon cyclic folding/unfolding.

The disclosed origami enabled manufacturing systems and methods can provide an example to utilize mainstream high-temperature processes to fabricate high performance stretchable electronics. For example, high-performance functional devices can be fabricated on rigid surfaces and do not experience large strain during deformation, and rigid surfaces can be joined by connection members (e.g., serpentine-shaped flexible polymers) that allow for a full-degree folding and unfolding, which can enable deformability. As an example, an origami enabled stretchable solar cells with metal traces embedded serpentine-shaped flexible polymers as connect members can be fabricated to achieve unprecedented deformability. In an aspect, to bear localized strain at the creases, hollow tubes can be used with connection members as cushions to minimize the strain at folding creases.

Figure 8:
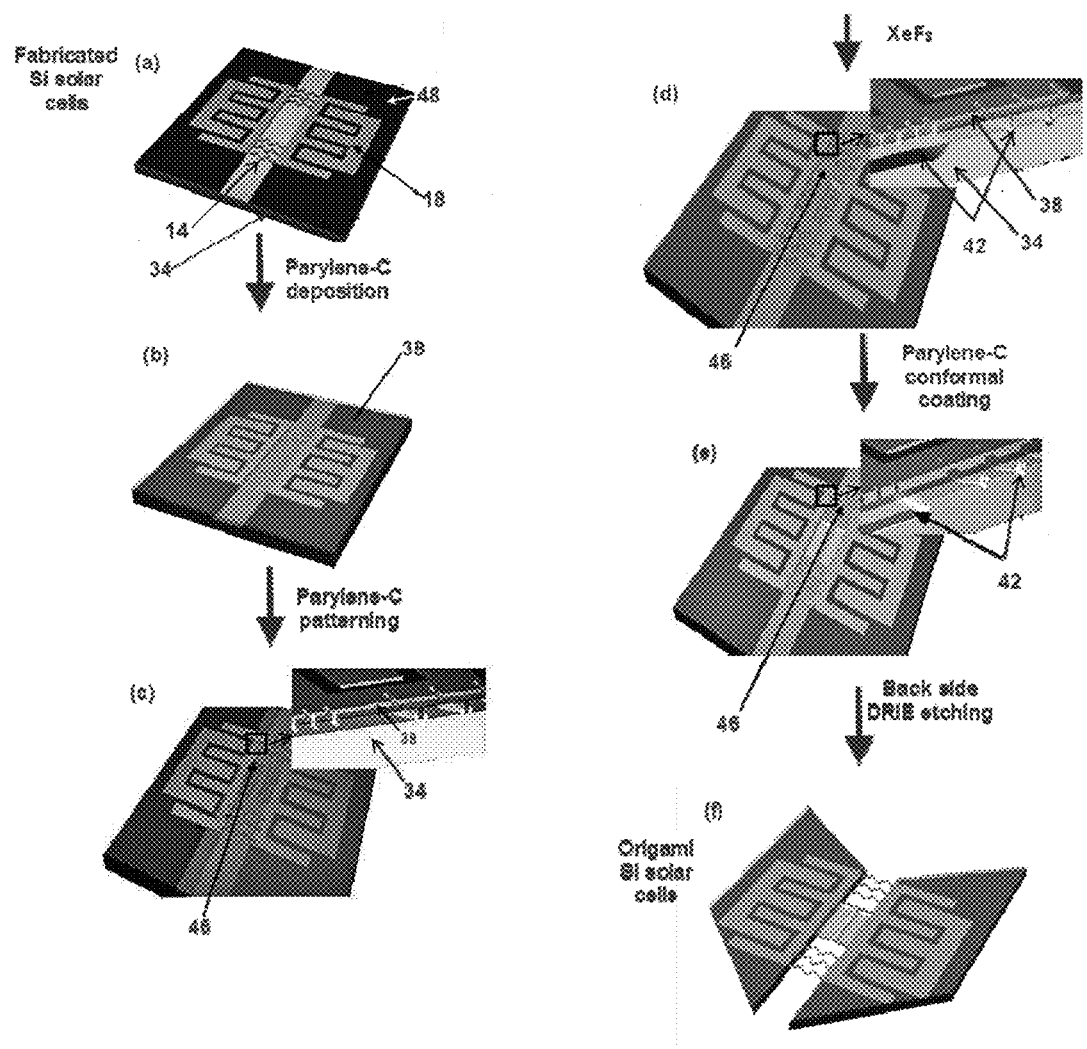
FIG. 8 illustrates a plurality of steps (steps a-f) of an examplary method for forming origami enabled stretchable silicon solar cells.

The fabrication processes can comprise two parts, fabrication of the silicon (Si) solar cells and fabrication of origami structure as shown in FIG. 8. In an aspect, the fabrication of the Si solar cells can be a standard process and compatible with mainstream high-temperature CMOS process. FIG. 8(a) shows two Si solar cells 18 can be fabricated on Si substrate 34, and two sets of serpentine shaped connection members 14 on top of Si wafer 34 can be utilized to connect two Si solar cells. In one aspect, two fabricated Si solar cells 18 can be attached to a $SiO_2$ surface 48 as illustrated in FIG. 8(a). Then a first Parylene-C layer 38 (poly-para-xylylene) can be vapor-phase deposited using a Parylene deposition system, as shown in FIG. 8(b). Parylene-C can be conformally deposited at room temperature. The first Parylene-C layer 38 can be then patterned using oxygen plasma to open small rectangular windows (e.g., 10 μm×50 μm in size and 10 μm apart between two windows) in rows along a central line of serpentine connection members 14. FIG. 8 (c) shows that metal traces can be embedded Parylene-C connection members 14. In an aspect, back illumination can be used. In addition to patterning along connects, Parylene-C in the central area between Si solar cells can also be patterned, which can form "a Parylene-C belt" 46 to enhance the mechanical integrity of the solar cells with creases. These patterned windows in Parylene-C can serve as masks for xenon difluoride ($XeF_2$) etching, a gas-phase isotropic Si etchant, as shown in FIG. 8(d). The Si substrate 34 can then be undercut etched through these windows by $XeF_2$, forming trenches 42 underneath the connection members 14 and "Parylene-C belt"46, as shown in FIGS. 8(d) and 8(e). These trenches can function as cushions to reduce localized stress at the connection members 14 (e.g., serpentine structures). In an aspect, deposition of a second layer of Parylene-C (15 μm in thickness) can then be conducted to conformally coat the trenches and form sealed Parylene-C microtubes underneath connection members 14 and "Parylene-C belt"46, as shown in FIG. 8(e). The second layer of Parylene-C can be patterned by oxygen plasma to shape the outline of the device and open contact pads, followed by an etching method (e.g., backside deep reactive-ion etching (DRIE)) using a photoresist as mask to release the origami Si solar cells.

Figure 9:
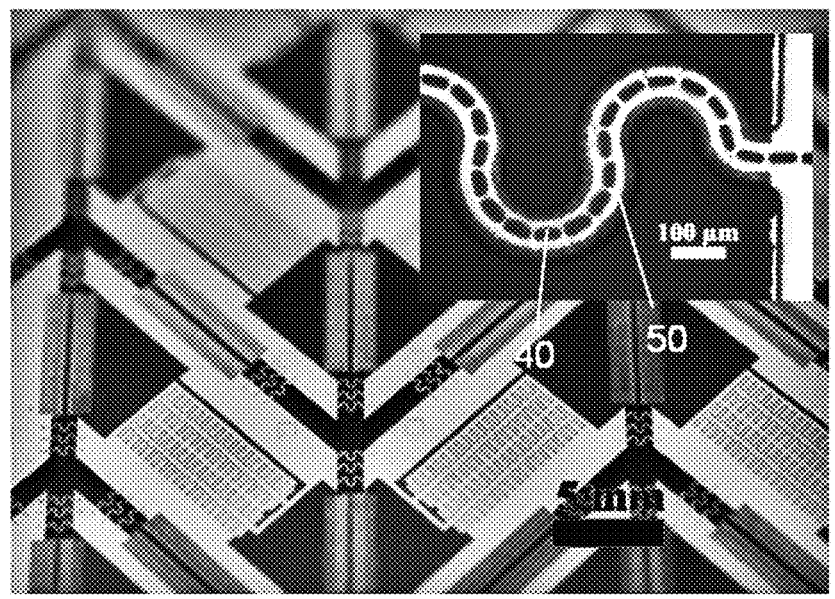
FIG. 9 illustrates optical pictures of a fabricated origami enabled silicon solar cells, with (a) for unfolded state and (b) folded state.
Figure 9:
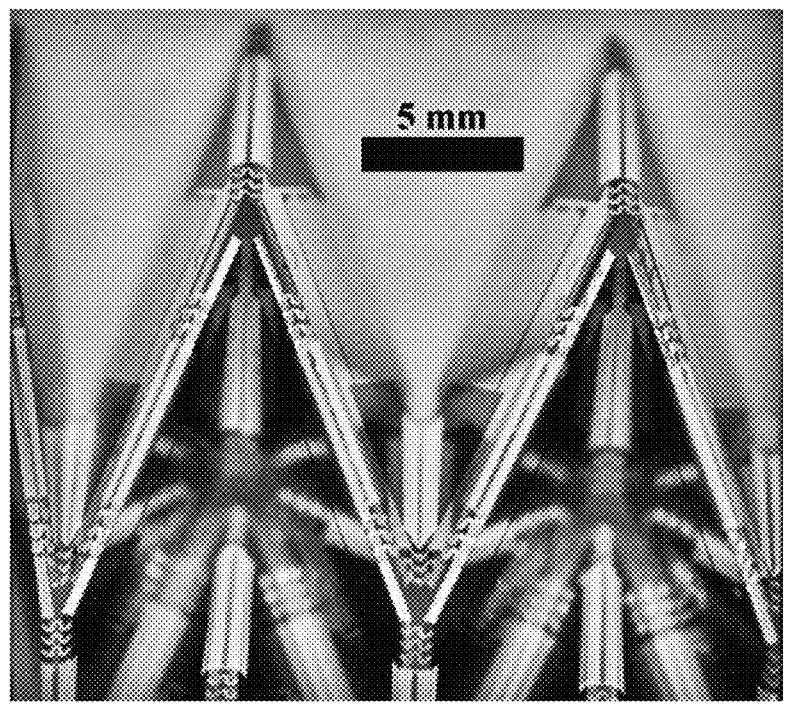

FIG. 9 illustrates a plurality of photographs showing fabricated solar cells at unfolded (a) and folded (b) states. The solar cells can comprise 20 parallelograms that are electrically linked by metal traces embedded serpentine connection members. FIG. 9a shows a unfolded state with an inset of an optical micrograph of the serpentine connection member. The size of each parallelogram is 1 $cm^2$ and the slit is 0.1 cm in width. On each parallelogram, the solar cell covers 0.2 $cm^2$, which leads to 20% areal coverage, which can be significantly improved by optimized solar cell layout design. It is expected that 90% areal coverage can be reached. In the inset of FIG. 9a, etching holes 40 for $XeF_2$ undercut etching are dark, and the bright regions are gold traces 50 due to reflection of light. The Parylene-C layer that encapsulates the metal traces cannot be clearly seen because of its transparency. FIG. 9b shows a partially folded state confirming that the serpentine connection members can survive during folding.

Figure 10:
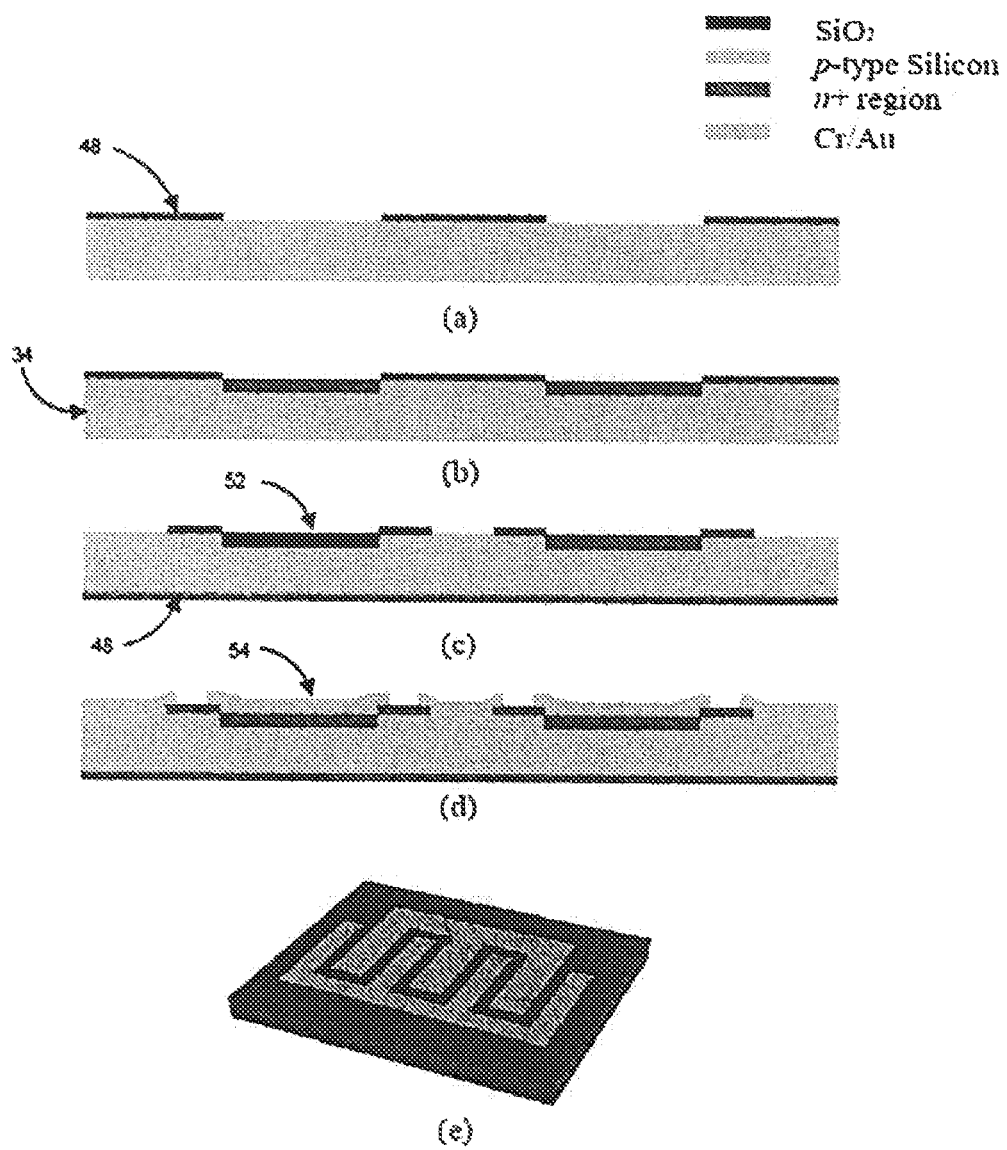
FIG. 10 is a block diagram illustrating an example fabrication process (steps a-e) of an exemplary method for forming of a function body of FIG. 9 according to one aspect.

FIG. 10 illustrates an exemplary fabrication process of a functional body shown in FIG. 8. The fabrication process can start from deposition of a thin layer of silicon dioxide ($SiO_2$) with 0.2 μm in thickness through lower pressure chemical vapor deposition (LPCVD) on a 380 μm-thick p-type single crystalline silicon (Si) wafer 34, followed by patterning through buffered oxide etch (BOE) using a photoresist as mask, as shown in FIG. 10a. Then the Si wafer 34 can be implanted with 31P+ to form the n+ region 52 using the patterned $SiO_2$ layer 48 as the mask, as shown in FIG. 10b. The Si wafer 34 can be annealed in a flow of dry N2 for 30 minutes at 900° C. to form a 0.5 μm-deep p-n+ junction. FIG. 10c illustrates the removal of $SiO_2$ from potential sites of metal contacts through BOE for about 10 minutes, followed by an antireflection coating of $SiO_2$ (75 nm in thickness) on the back side of the wafer by plasma-enhanced chemical vapor deposition (PECVD). Finally, metal contacts can be applied to the wafers using electron-beam evaporation of Cr/Au 54 (10 nm/200 nm in thickness) and metal interconnects can be formed between adjacent Si solar cells, as shown in FIG. 10d. FIG. 10e illustrates a fabricated Si solar cell on Si wafer 34.

Figure 11:
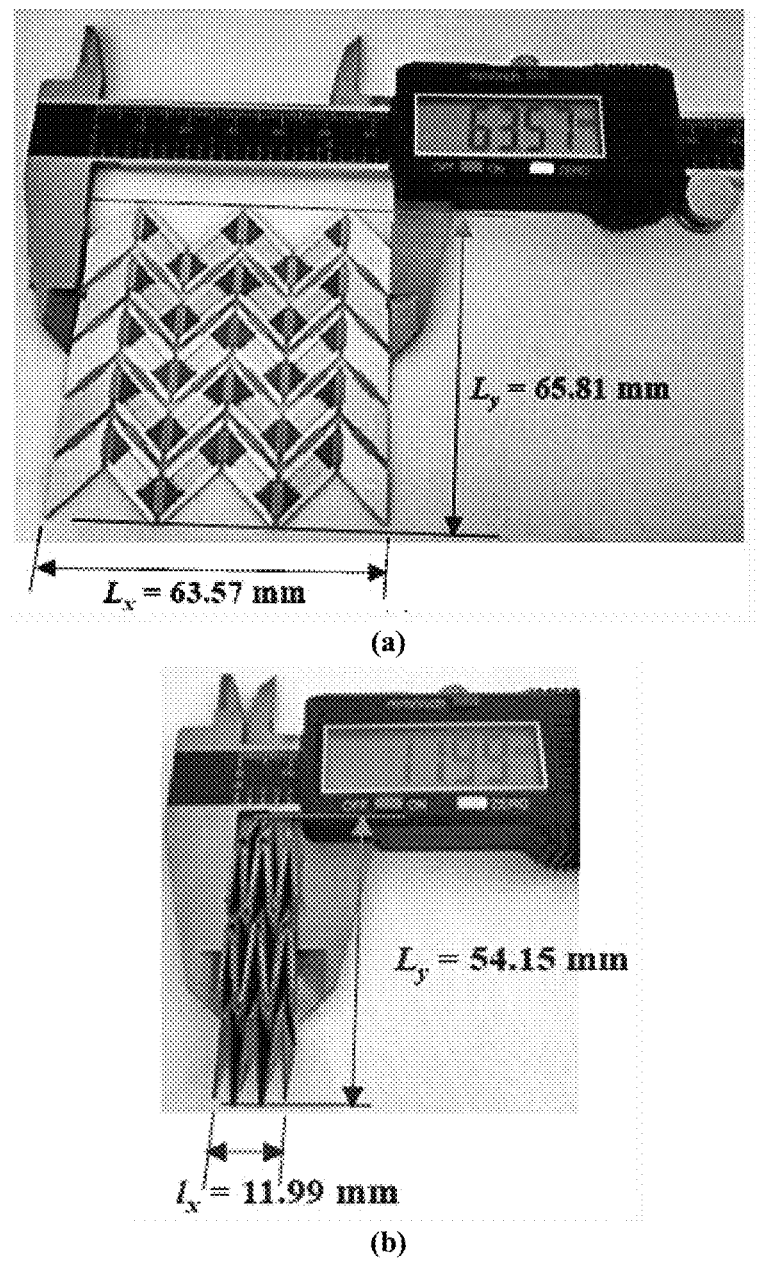
FIG. 11 illustrates measured dimensions of the origami-enabled Si solar cells at (a) unfolded state and (b) completely folded state.

FIG. 11 shows stretchability of origami based solar cells by defining linear compactness $\epsilon_{linear}$ and areal compactness $\epsilon_{Areal}$ using the dimensions.

$$\varepsilon_{Linear}^x = \frac{L_x}{l_x} \text{ for } x\text{-direction, } \varepsilon_{Linear}^y = \frac{L_y}{l_y} \text{ for } y\text{-direction,} \quad (1)$$

$$\varepsilon_{Areal} = \frac{L_x L_y}{l_x l_y} = \varepsilon_{Linear}^x \varepsilon_{Linear}^y. \quad (2)$$

Lx and Ly are dimensions for the completely unfolded state in x- and y-directions as shown in FIG. 10a, respectively; and their counterparts for the completely folded states are denoted by lower case letter "l" as shown in FIG. 11b. The measured dimensions shown in FIG. 11 demonstrates that the origami-based solar cells have realized up to 530% linear compactness in x-direction and 644% areal compactness.

In an aspect, the origami enabled manufacturing systems and methods can be implemented on a computer as an automated manufacturing process. Similarly, the methods and systems disclosed can utilize one or more computers to perform one or more functions in one or more locations.

The present methods and systems can be operational with numerous other general purpose or special purpose computing system environments or configurations. Examples of well known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that the systems and methods disclosed herein can be implemented via a general-purpose computing device in the form of a computer. The components of the computer can comprise, but are not limited to, one or more processors, a system memory, and a system bus that couples various system components including the processor to the system memory.

The methods and systems described above require no particular component or function. Thus, any described component or function—despite its advantages—is optional. Also, some or all of the described components and functions described above can be used in connection with any number of other suitable components and functions.

Although several embodiments of the invention have been disclosed in the foregoing specification, it is understood by those skilled in the art that many modifications and other embodiments of the invention will come to mind to which the invention pertains, having the benefit of the teaching presented in the foregoing description and associated drawings. It is thus understood that the invention is not limited to the specific embodiments disclosed hereinabove, and that many modifications and other embodiments are intended to be included within the scope of the appended claims. Moreover, although specific terms are employed herein, as well as in the claims which follow, they are used only in a generic and descriptive sense, and not for the purposes of limiting the described invention, nor the claims which follow.

What is claimed is:

1. An origami enabled manufacturing system comprising:
a plurality of functional bodies, each functional body having a plurality of side edges, wherein the plurality of functional bodies are arrayed in a predetermined pattern, and wherein the plurality of side edges define a plurality of creases in the predetermined pattern, and wherein at least one side edge of each functional body is positioned in opposition to at least one side edge of another functional body in the predetermined pattern; and
a plurality of connection members, wherein at least one connection member is coupled to and positioned between opposed functional bodies, and wherein each connection member is selectively movable between a fixed position, in which no relative movement between connected functional bodies is allowed, and a pliable position, in which relative movement between connected functional bodies is allowed
wherein each functional body comprises: a substrate; and a functional device attached to the substrate;
wherein at least one lower channel is defined on a bottom surface of the substrate proximate a side edge of the functional body that forms a crease in the predetermined pattern, and
wherein at least one upper channel is defined on a top surface of the substrate proximate a side edge of the functional body that forms a crease in the predetermined pattern.

2. The system of claim 1, wherein at least one side edge of each functional body is positioned adjacent to at least one side edge of another functional body in the predetermined pattern.

3. The system of claim 2, wherein at least one side edge of each functional body is positioned substantially parallel to at least one side edge of another functional body in the predetermined pattern.

4. The system of claim 1, wherein the substrate is a silicon substrate.

5. The system of claim 1, wherein at least a portion of the substrate is a foldable substrate.

6. The system of claim 1, wherein at least a portion of the substrate is a rigid substrate.

7. The system of claim 1, further comprising means for selectively actuating the at least one connection member to allow for the selective displacement of the at least one functional body relative to another functional body.

8. The system of claim 7, wherein the means for selectively actuating the at least one connection member at least comprises an electrode.

9. The system of claim 7, wherein the means for selectively actuating the at least one connection member comprises a fluidic channel.

10. The system of claim 1, wherein the means for selectively actuating the at least one connection member comprises a mechanical hinge.

11. The system of claim 1, wherein the at least one connection member is serpentine shaped.

12. The system of claim 1, wherein the at least one connection member is substantially C shaped.

13. The system of claim 1, wherein the at least one connection member is substantially U shaped.

14. The system of claim 1, wherein the at least one connection member is substantially linear.

15. The system of claim 1, wherein the at least one connection member comprises polymer.

16. The system of claim 15, wherein the polymer is poly-para-xylylene.

17. The system of claim 15, wherein the at least one connection member further comprises metal trace.

18. The system of claim 15, wherein the polymer comprises an electrically conductive polymer.

19. The system of claim 1, wherein the plurality of upper and lower channels are parallel to the plurality of side edges of the plurality of functional bodies.

20. The system of claim 19, wherein at least a portion of the plurality of upper channels underlies at least a portion of the at least one connection member.

21. The system of claim 20, wherein the at least one lower channel comprises a plurality of lower channels, wherein the at least one upper channel comprises a plurality of upper channels, and wherein each lower channel of the plurality of lower channels underlies one respective upper channel of the plurality of upper channels.

22. The system of claim 20, wherein the plurality of upper channels and the plurality of lower channels are selectively filled with air at a select air pressure.

23. The system of claim 22, wherein the air pressure in the upper and lower channels can be different.

\* \* \* \* \*